(12) United States Patent
Feng et al.

(10) Patent No.: US 10,777,128 B2
(45) Date of Patent: Sep. 15, 2020

(54) PIXEL CIRCUITRY WITH MOBILITY COMPENSATION

(71) Applicants: BOE Technology Group Co., Ltd., Beijing (CN); HEFEI XINSHENG OPTOELECTRONICS TECHNOLOGY CO., LTD., Anhui (CN)

(72) Inventors: Xuehuan Feng, Beijing (CN); Zhidong Yuan, Beijing (CN); Zhenfei Cai, Beijing (CN); Meng Li, Beijing (CN); Can Yuan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/981,020

(22) Filed: May 16, 2018

(65) Prior Publication Data

US 2019/0164476 A1   May 30, 2019

(30) Foreign Application Priority Data

Nov. 27, 2017   (CN) .......................... 2017 1 1204071

(51) Int. Cl.
*G09G 5/00*      (2006.01)
*G09G 3/3225*    (2016.01)
(Continued)

(52) U.S. Cl.
CPC ......... *G09G 3/3225* (2013.01); *G09G 3/3233* (2013.01); *H01L 27/3274* (2013.01);
(Continued)

(58) Field of Classification Search
CPC .... G09G 3/325; G09G 3/3225; G09G 3/3233; G09G 3/3208; H01L 27/3274; H01L 51/0554; H01L 51/102
(Continued)

(56) References Cited

U.S. PATENT DOCUMENTS 8,558,767 B2   10/2013 Kwon
10,262,595 B2   4/2019 Zhang
(Continued)

FOREIGN PATENT DOCUMENTS

CN   101373578 A   2/2009
CN   104732927 A   6/2015
(Continued)

OTHER PUBLICATIONS

Office Action, including Search Report, for Chinese Patent Application No. 201711204071.3, dated Mar. 26, 2019, 14 pages.

*Primary Examiner* — Adam J Snyder
(74) *Attorney, Agent, or Firm* — Westman, Champlin & Koehler, P.A.

(57) ABSTRACT

The present disclosure discloses a pixel circuit, a display apparatus and a dual-gate driving transistor. The pixel circuit comprises a dual-gate driving transistor having a drain electrically connected to a first power supply terminal; a threshold voltage compensation unit electrically connected to a data terminal, a first control terminal, a first gate of the dual-gate driving transistor, and a source of the dual-gate driving transistor respectively; a mobility compensation unit electrically connected to a sensing signal terminal, a second control terminal, and the source of the dual-gate driving transistor respectively; and a light emitting control unit electrically connected to the data terminal, a third control terminal, a second gate of the dual-gate driving transistor, the source of the dual-gate driving transistor, and a light emitting device respectively. The threshold voltage compen- (Continued)

sation unit and the mobility compensation unit perform threshold voltage compensation for the dual-gate driving transistor under the control of the data terminal, the first control terminal, the sensing signal terminal, and the second control terminal; and the mobility compensation unit and the light emitting control unit perform mobility compensation for the dual-gate driving transistor and control the dual-gate driving transistor to drive the light emitting device to emit light under the control of the sensing signal terminal, the second control terminal, the data terminal, and the third control terminal.

10 Claims, 4 Drawing Sheets

(51) Int. Cl.
    *H01L 27/32*     (2006.01)
    *H01L 51/05*     (2006.01)
    *G09G 3/3233*     (2016.01)
    *G09G 3/3208*     (2016.01)
    *H01L 51/10*     (2006.01)

(52) U.S. Cl.
    CPC ....... *H01L 51/0554* (2013.01); *G09G 3/3208* (2013.01); *G09G 2300/0819* (2013.01); *G09G 2300/0852* (2013.01); *G09G 2310/0262* (2013.01); *G09G 2310/08* (2013.01); *G09G 2320/0233* (2013.01); *G09G 2320/0295* (2013.01); *G09G 2320/045* (2013.01); *H01L 51/102* (2013.01)

(58) Field of Classification Search
    USPC .................................................. 345/76, 214
    See application file for complete search history.

(56) References Cited

U.S. PATENT DOCUMENTS

| | | | |
|---|---|---|---|
| 2004/0174349 A1* | 9/2004 | Libsch | G09G 3/3233 345/204 |
| 2015/0171156 A1* | 6/2015 | Miyake | H01L 27/1225 257/43 |
| 2015/0187276 A1* | 7/2015 | Shim | G09G 3/3233 345/77 |
| 2015/0379923 A1* | 12/2015 | Lee | G09G 3/3233 345/206 |
| 2016/0042694 A1* | 2/2016 | Lim | G09G 3/3233 345/78 |
| 2016/0260373 A1* | 9/2016 | Miyake | G09G 3/2007 |
| 2016/0329392 A1* | 11/2016 | Miyake | G09G 3/3258 |
| 2017/0337875 A1* | 11/2017 | Jeon | G09G 3/3258 |
| 2018/0190194 A1* | 7/2018 | Zhu | G09G 3/3258 |
| 2018/0233082 A1 | 8/2018 | Wang et al. | |

FOREIGN PATENT DOCUMENTS

| | | |
|---|---|---|
| CN | 106910459 A | 6/2017 |
| CN | 107134261 A | 9/2017 |
| EP | 2 028 639 B1 | 7/2017 |

\* cited by examiner

PIXEL CIRCUITRY WITH MOBILITY COMPENSATION

CROSS-REFERENCE TO RELATED APPLICATION(S)

This application claims priority to the Chinese Patent Application No. 201711204071.3, filed on Nov. 27, 2017, which is incorporated herein by reference in its entirety.

TECHNICAL FIELD

The present disclosure relates to the field of display technology, and more particularly, to a pixel circuit, a display apparatus, and a dual-gate driving transistor.

BACKGROUND

Currently, with the rapid development of display panels, Organic Light Emitting Diodes (OLEDs) have become the trend of the display panel industry in the future with their high contrast and low power consumption.

The conventional OLED pixel circuit has a 2T1C driving structure, but due to the instability of a driving transistor, a threshold voltage and a mobility of the driving transistor need to be compensated. Generally, the threshold voltage may be compensated by internal compensation or external compensation, but no matter whether it is compensated by the internal compensation or the external compensation, it is very difficult to perform threshold voltage compensation and mobility compensation for the driving transistor at the same time since it is difficult to measure the mobility of the driving transistor, and the mobility of the driving transistor usually can only be measured by using a complex circuit structure or a complex control timing.

SUMMARY

In order to achieve the above purposes, according to a first aspect of the present disclosure, there is proposed a pixel circuit, comprising: a dual-gate driving transistor having a drain electrically connected to a first power supply terminal; a threshold voltage compensation unit electrically connected to a data terminal, a first control terminal, a first gate of the dual-gate driving transistor, and a source of the dual-gate driving transistor respectively; a mobility compensation unit electrically connected to a sensing signal terminal, a second control terminal, and the source of the dual-gate driving transistor respectively; and a light emitting control unit electrically connected to the data terminal, a third control terminal, a second gate of the dual-gate driving transistor, the source of the dual-gate driving transistor, and a light emitting device respectively, wherein, the threshold voltage compensation unit and the mobility compensation unit perform threshold voltage compensation for the dual-gate driving transistor under the control of the data terminal, the first control terminal, the sensing signal terminal, and the second control terminal; and the mobility compensation unit and the light emitting control unit perform mobility compensation for the dual-gate driving transistor and control the dual-gate driving transistor to drive the light emitting device to emit light under the control of the sensing signal terminal, the second control terminal, the data terminal, and the third control terminal.

In an embodiment of the present disclosure, the threshold voltage compensation unit comprises: a first transistor having a source electrically connected to the data terminal, and a gate electrically connected to the first control terminal; and a first capacitor having one terminal electrically connected to a drain of the first transistor and the first gate of the dual-gate driving transistor respectively, and the other terminal electrically connected to the source of the dual-gate driving transistor.

In an embodiment of the present disclosure, the mobility compensation unit comprises: a second transistor having a source electrically connected to the sensing signal terminal, a gate electrically connected to the second control terminal, and a drain electrically connected to the source of the dual-gate driving transistor and the other terminal of the first capacitor respectively.

In an embodiment of the present disclosure, when both the first transistor and the second transistor are turned on under the control of the first control terminal and the second control terminal, the data terminal outputs a first data voltage, and the sensing signal terminal outputs a first sensing voltage, and when both the first transistor and the second transistor are turned off under the control of the first control terminal and the second control terminal, the first capacitor stores a threshold voltage of the dual-gate driving transistor under the action of both the first data voltage and the first sensing voltage.

In an embodiment of the present disclosure, the first data voltage is greater than the threshold voltage of the dual-gate driving transistor, and the first sensing voltage is zero.

In an embodiment of the present disclosure, the light emitting control unit comprises: a third transistor having a source electrically connected to the data terminal, and a gate electrically connected to the third control terminal; and a second capacitor having one terminal electrically connected to a drain of the third transistor and the second gate of the dual-gate driving transistor respectively, and the other terminal electrically connected to the source of the dual-gate driving transistor and one terminal of the light emitting device, wherein the other terminal of the light emitting device is electrically connected to a second power supply terminal.

In an embodiment of the present disclosure, when the second transistor and the third transistor are turned on under the control of the second control terminal and the third control terminal, the data terminal outputs a second data voltage for a first preset time, and the sensing signal terminal firstly outputs a second sensing voltage and then is in a floating state within the first preset time, so that the sensing signal terminal is charged; when the second transistor and the third transistor are turned off under the control of the second control terminal and the third control terminal, the mobility compensation unit is configured to detect a charging voltage at the sensing signal terminal, acquire a mobility according to the charging voltage, and acquire a mobility compensation value according to the mobility; and when the second transistor and the third transistor are turned on under the control of the second control terminal and the third control terminal, the source of the dual-gate driving transistor receives the mobility compensation value, and the second gate of the dual-gate driving transistor receives a third data voltage from the data terminal to perform mobility compensation for the dual-gate driving transistor while the light emitting control unit controls the light emitting device to emit light.

In an embodiment of the present disclosure, a sum of the second data voltage and the second sensing voltage is less than a voltage required for the light emitting device to emit light.

According to a second aspect of the present disclosure, there is proposed a display apparatus, comprising the pixel circuit according to claim 1.

According to a third aspect of the present disclosure, there is proposed a driving method of the pixel circuit according to claim 1, comprising:

in a first phase, controlling the data terminal to output a first data voltage, and controlling the sensing signal terminal to output a first sensing voltage;

in a second phase, storing a threshold voltage of the dual-gate driving transistor in the threshold compensation unit under the control of the first data voltage and the first sensing voltage;

in a third phase, controlling the data terminal to output a second data voltage for a first preset time, and controlling the sensing signal terminal to firstly output a second sensing voltage and then be in a floating state within the first preset time, so that the sensing signal terminal is charged;

in a fourth phase, detecting a charging voltage at the sensing signal terminal, acquiring a mobility according to the charging voltage, and acquiring a mobility compensation value according to the mobility; and in a fifth phase, controlling to input the mobility compensation value into the source of the dual-gate driving transistor, and writing a third data voltage from the data terminal into the second gate of the dual-gate driving transistor, to perform mobility compensation for the dual-gate driving transistor while the light emitting control unit controls the light emitting device to emit light.

According to a fourth aspect of the present disclosure, there is proposed a dual-gate driving transistor, comprising: a light shielding metal layer disposed on a substrate and serving as a second gate of the dual-gate driving transistor; a buffer layer disposed on the light shielding metal layer and the substrate; an organic semiconductor layer disposed on the buffer layer; an insulating layer disposed on the organic semiconductor layer; a gate layer disposed on the insulating layer and serving as a first gate of the dual-gate driving transistor; a perforated layer disposed on the buffer layer, the organic semiconductor layer, the insulating layer, and the gate layer and comprising a first via hole and a second via hole; and a source layer and a drain layer disposed on the perforated layer respectively, wherein the source layer is connected to one terminal of the organic semiconductor layer through the first via hole and the drain layer is connected to the other terminal of the organic semiconductor layer through the second via hole.

DETAILED DESCRIPTION

Embodiments of the present disclosure will be described in detail below. Examples of the embodiments are illustrated in the accompanying drawings, throughout which the same or similar reference signs denote the same or similar elements or elements having the same or similar functions. The embodiments described below with reference to the accompanying drawings are exemplary and are intended to explain the present disclosure, but should not be construed as limiting the present disclosure.

A pixel circuit, a display apparatus, and a dual-gate driving transistor according to the embodiments of the present disclosure will be described below with reference to the accompanying drawings. Before describing the pixel circuit according to the embodiments of the present disclosure, it will be explained in detail why the conventional 2T1C pixel circuit causes uneven display due to a shift in the threshold voltage and a variation in the mobility.

Figure 1:
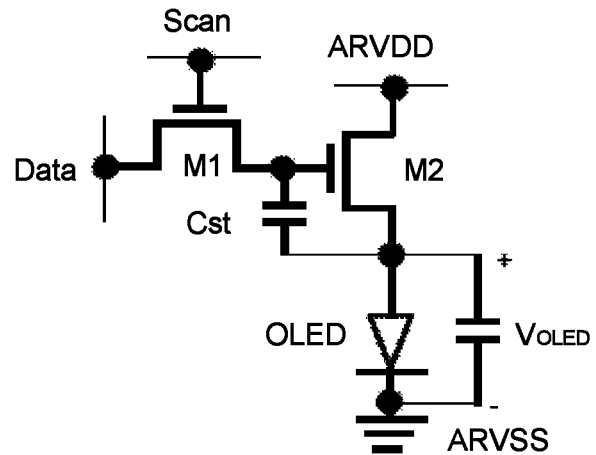
FIG. 1 is a structural diagram of a conventional 2T1C pixel circuit.

Specifically, as shown in FIG. 1, the conventional 2T1C pixel circuit comprises a switch transistor M1, a driving transistor M2, and a storage capacitor Cst, wherein the switch transistor M1 is configured to control an input of a data voltage on a data line Data, the driving transistor M2 is configured to control light emitting current of an organic light emitting diode OLED, and the storage capacitor Cst is configured to provide a bias to a gate of the driving transistor M2 and maintain a voltage of the gate of the driving transistor M2.

The 2T1C pixel circuit comprises two phases in a frame time. A first phase is a data writing phase, in which a row scan line Scan is at a high level, and at this time, the switch transistor M1 is turned on (the switch transistor M1 is active at the high level), the data voltage on the data line Data is written into one terminal of the storage capacitor Cst through a channel between a drain and a source of the switch transistor M1, and at the same time is applied to a gate of the driving transistor M2 so that the driving transistor M2 is turned on to drive the organic light emitting diode OLED to emit light. A second phase is a display maintenance phase, in which the row scan line Scan is at a low level, and at this time, the switch transistor M1 is turned off, and a channel between the data line Data and the storage capacitor Cst is turned off. At this time, under the action of the storage capacitor Cst, the driving transistor M2 is maintained to be turned on to maintain the organic light emitting diode OLED to emit light until a next frame time arrives. When the organic light emitting diode OLED emits light, current flowing through the organic light emitting diode OLED is $$I_{OLED}=(1/2)C_{ox}(\mu W/L)(V_{Data}-V_{OLED}-V_{ARVSS}-V_{th})^2,$$

wherein $C_{ox}$, $\mu$, W, and L are channel capacitance, a channel mobility, a channel width and a channel length per unit area of the driving transistor, $V_{Data}$ is the data voltage on the data line Data, $V_{OLED}$ is a voltage drop of the organic light emitting diode, $V_{ARVSS}$ is a voltage at a direct current power supply low voltage terminal, and $V_{th}$ is a threshold voltage of the driving transistor.

It can be seen from the above formula that the current $I_{OLED}$ flowing through the organic light emitting diode OLED is related to the threshold voltage $V_{th}$ and the channel mobility $\mu$ of the driving transistor, wherein the threshold voltage $V_{th}$ of the driving transistor is unstable during the lifetime of the driving transistor, and the channel mobility $\mu$ may also degrade over time. Therefore, both the threshold voltage $V_{th}$ and the channel mobility $\mu$ may affect the current $I_{OLED}$ flowing through the organic light emitting diode OLED, thereby resulting in uneven display.

In order to effectively solve the above situation, the present disclosure proposes a pixel circuit, through which threshold voltage compensation and mobility compensation can be performed on the driving transistor at the same time to ensure the uniform display.

Figure 2:
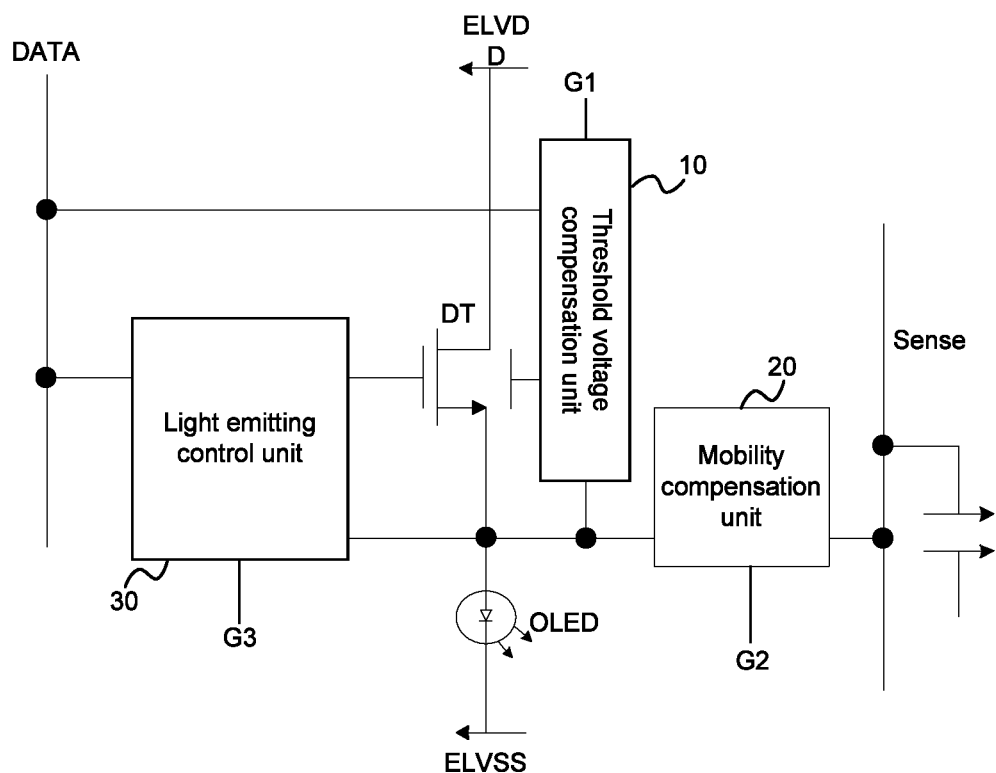
FIG. 2 is a block diagram of a pixel circuit according to an embodiment of the present disclosure.

FIG. 2 is a block diagram of a pixel circuit according to an embodiment of the present disclosure. As shown in FIG. 2, the pixel circuit according to the embodiment of the present disclosure comprises a first power supply terminal ELVDD, a dual-gate driving transistor DT, a threshold voltage compensation unit 10, a mobility compensation unit 20, and a light emitting control unit 30.

The dual-gate driving transistor DT has a drain electrically connected to the first power supply terminal ELVDD. The threshold voltage compensation unit 10 is electrically connected to a data terminal DATA, a first control terminal G1, a first gate of the dual-gate driving transistor DT and a source of the dual-gate driving transistor DT respectively. The mobility compensation unit 20 is electrically connected to a sensing signal terminal Sense, a second control terminal G2 and the source of the dual-gate driving transistor DT respectively. The light emitting control unit 30 is electrically connected to the data terminal DATA, a third control terminal G3, a second gate of the dual-gate driving transistor DT, the source of the dual-gate driving transistor DT and a light emitting device OLED respectively. The threshold voltage compensation unit 10 and the mobility compensation unit 20 are controlled by the data terminal DATA, the first control terminal G1, the sensing signal terminal Sense, and the second control terminal G2 to perform threshold voltage compensation for the dual-gate driving transistor DT, and the mobility compensation unit 20 and the light emitting control unit 30 are controlled by the sensing signal terminal Sense, the second control terminal G2, the data terminal DATA, and the third control terminal G3 to perform mobility compensation for the dual-gate driving transistor DT and control the dual-gate driving transistor DT to drive the light emitting device OLED to emit light.

Specifically, in the embodiments of the present disclosure, the existing driving transistor may be replaced with a driving transistor structure having two gates (a dual-gate driving transistor for short), which can be obtained by improving a structure of the existing driving transistor. For example, a light shielding metal layer of a top gate of the existing driving transistor may be used as another metal electrode of the driving transistor to form a bottom gate of the dual-gate driving transistor, wherein the top gate is a first gate of the dual-gate driving transistor, and the bottom gate is a second gate of the dual-gate driving transistor. Then, the two gates of the dual-gate driving transistor are used for threshold voltage compensation and mobility compensation respectively, so as to realize compensation for the threshold voltage and the mobility at the same time.

For example, one frame time for display of the pixel circuit may be divided into a plurality of phases. In one of the phases, the threshold voltage compensation unit 10 and the mobility compensation unit 20 cooperate with each other to realize threshold voltage compensation for the dual-gate driving transistor DT through the first gate of the dual-gate driving transistor DT. In another one of the phases, the mobility compensation unit 20 and the light emitting control unit 30 cooperate with each other to realize mobility compensation for the dual-gate driving transistor DT through the second gate of the dual-gate driving transistor DT. Then, the light emitting device OLED is controlled to emit light under the action of both the threshold voltage compensation and the mobility compensation, which realizes the threshold voltage compensation and the mobility compensation for the dual-gate driving transistor at the same time, thereby ensuring the uniform display.

How to perform the threshold voltage compensation and the mobility compensation will be described in detail below in conjunction with specific examples of the present disclosure.

Figure 3:
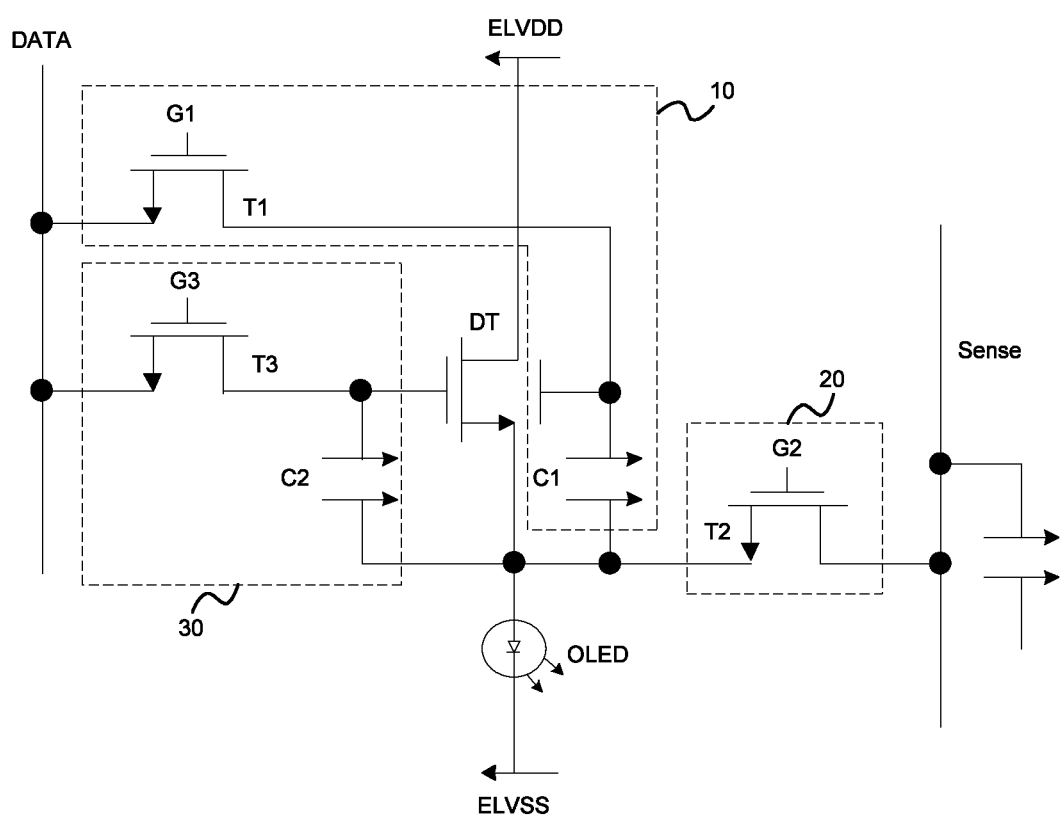
FIG. 3 is a structural diagram of a pixel circuit according to an embodiment of the present disclosure.

According to an embodiment of the present disclosure, as shown in FIG. 3, the threshold voltage compensation unit 10 comprises a first transistor T1 and a first capacitor C1. The first transistor T1 has a source electrically connected to the data terminal DATA, and a gate electrically connected to the first control terminal G1. The first capacitor C1 has one terminal electrically connected to a drain of the first transistor T1 and the first gate of the dual-gate driving transistor DT respectively, and the other terminal electrically connected to the source of the dual-gate driving transistor DT.

The mobility compensation unit 20 comprises a second transistor T2 having a source electrically connected to the other terminal of the first capacitor C1, a gate electrically connected to the second control terminal G2, and a drain electrically connected to the sensing signal terminal Sense.

When both the first transistor T1 and the second transistor T2 are turned on under the control of the first control terminal G1 and the second control terminal G2, the data terminal DATA outputs a first data voltage Vdata1 to one terminal of the capacitor C1 and the sensing signal terminal Sense outputs a first sensing voltage Vsense1 to the other terminal of the capacitor C1. When both the first transistor T1 and the second transistor T2 are turned off under the control of the first control terminal G1 and the second control terminal G2, the threshold voltage of the dual-gate driving transistor DT is stored in the first capacitor C1 under the action of both the first data voltage Vdata1 and the first sensing voltage Vsense1.

According to an embodiment of the present disclosure, the first data voltage Vdata1 is greater than the threshold voltage Vth of the dual-gate driving transistor DT, and the first sensing voltage Vsense1 is zero.

Specifically, as shown in FIG. 3, when the threshold voltage of the dual-gate driving transistor DT is detected, the first control terminal G1 and the second control terminal G2 output a high level respectively. At this time, both the first transistor T1 and the second transistor T2 are turned on, and at the same time, the data terminal DATA writes a first data voltage Vdata1 (of, for example, about 2V, and the threshold voltage Vth of the dual-gate driving transistor is typically about 1V), and the sensing signal terminal Sense writes a first sensing voltage Vsense1 (of, for example, about 0V). At this time, voltages at two terminals of the first capacitor C1 are Vdata1 and Vsense1 respectively. Then, the first control terminal G1 and the second control terminal G2 output a low level respectively. At this time, both the first transistor T1 and the second transistor T2 are turned off, and the voltage at the other terminal of the first capacitor C1 starts to be gradually charged up to Vdata1-Vth-Vsense1 (when the first sensing voltage Vsense1 is 0V, the voltage at the other terminal of the first capacitor C1 will be Vdata1-Vth), and a voltage is stored in the first capacitor C1 as Vth, that is, the threshold voltage Vth of the dual-gate driving transistor DT is stored in the first capacitor C1. In this way, the threshold voltage compensation for the dual-gate driving transistor can be realized by the voltage stored in the first capacitor C1 without writing data of the threshold voltage back.

It should be illustrated that in the embodiments of the present disclosure, the threshold voltage Vth of the dual-gate driving transistor DT may also be stored in the first capacitor C1 through the first power supply terminal ELVDD, but this method may lead to a problem of a long detection time of the threshold voltage. Specifically, when the threshold voltage of the dual-gate driving transistor DT is detected, if the first sensing voltage Vsense1 of about 0V is input through the second transistor T2 and the first data voltage Vdata1 of about 2V is input through the first transistor T1, a gate-source voltage Vgs of the dual-gate driving transistor DT is equal to 2V, and the dual-gate driving transistor DT can be in a critical turn-on state as long as the gate voltage of the dual-gate driving transistor DT is decreased by about 1V. If an initial value of the gate voltage, i.e., 24V, is written from the first power supply ELVDD, the dual-gate driving transistor DT can be in the critical turn-on state only if the gate voltage is decreased by about 23V, which takes a very long time. Therefore, this method is generally applied to power-off or black picture compensation, and it is difficult to complete this method in one frame for display. Therefore, the initial value of, for example, about 2V of the voltage, is written through the data terminal DATA, which can greatly reduce the time for detecting the threshold voltage, thereby reducing the power consumption in the detection of the threshold voltage of the panel.

In addition, when the threshold voltage of the first gate of the dual-gate driving transistor DT is detected, the second gate of the dual-gate driving transistor DT needs to be in an interference-free state. For example, conductive particles in a semiconductor layer (for example, an IGZO layer) of the dual-gate driving transistor DT are in a force-free natural state before the detection of the threshold voltage. If a voltage difference between the second gate and the source is applied with a value greater than the threshold voltage in the process of the detection of the threshold voltage, before the detection of the threshold voltage, the conductive particles in the semiconductor layer are in a force-applied movement state, which may affect the accuracy of the detection of the threshold voltage. When the threshold voltage is detected, it needs to activate directional movement of a part of the particles using a voltage difference. However, due to the voltage difference between the second gate and the source, a part of the particles are already in a movement state. As a result, the difference voltage between the first gate and the source which is required for activating the directional movement of the particles may change, which leads to inaccurate detection of the threshold voltage.

Therefore, in the embodiments of the present disclosure, there is initially no voltage at the second gate of the dual-gate driving transistor, and therefore the threshold voltage is not affected by the second gate in the process of forming a voltage difference which is equal to a value of the threshold voltage between the first gate and the source. Therefore, an accurate threshold voltage can be obtained, and the threshold voltage is always stored in the first capacitor, so that the threshold voltage compensation for the dual-gate driving transistor can be realized without writing data of the threshold voltage back.

According to an embodiment of the present disclosure, as shown in FIG. 3, the light emitting control unit 30 comprises a third transistor T3 and a second capacitor C2. The third transistor T3 has a source electrically connected to the data terminal DATA, and a gate electrically connected to the third control terminal G3. The second capacitor C2 has one terminal electrically connected to a drain of the third transistor T3 and the second gate of the dual-gate driving transistor DT respectively, and the other terminal electrically connected to the source of the dual-gate driving transistor DT and one terminal of the light emitting device OLED, wherein the other terminal of the light emitting device OLED is electrically connected to a second power supply terminal ELVSS.

When the second transistor T2 and the third transistor T3 are turned on under the control of the second control terminal G2 and the third control terminal G3, the data terminal DATA outputs a second data voltage Vdata2 for a first preset time, and the sensing signal terminal Sense firstly outputs a second sensing voltage Vsense2 and then is in a floating state within the first preset time, so that the sensing signal terminal Sense is charged. When the second transistor T2 and the third transistor T3 are turned off under the control of the second control terminal G2 and the third control terminal G3, a charging voltage at the sensing signal terminal Sense is also detected, a mobility is acquired according to the charging voltage, and a mobility compensation value is acquired according to the mobility. When the second transistor T2 and the third transistor T3 are turned on under the control of the second control terminal G2 and the third control terminal G3, the mobility compensation value is also written into the source of the dual-gate driving transistor DT, and a third data voltage Vdata3 is written into the second gate of the dual-gate driving transistor DT, to perform mobility compensation for the dual-gate driving transistor DT while controlling the light emitting device OLED to emit light.

According to an embodiment of the present disclosure, a sum of the second data voltage Vdata2 and the second sensing voltage Vsense2 is less than a voltage required for the light emitting device OLED to emit light.

Specifically, as shown in FIG. 3, when the mobility of the dual-gate driving transistor DT is detected, the second control terminal G2 and the third control terminal G3 output a high level respectively. At this time, both the second transistor T2 and the third transistor T3 are turned on, and at the same time, the data terminal DATA outputs a second data voltage Vdata2 (of, for example, about 3V) for a first preset time, and the sensing signal terminal Sense firstly outputs a second sensing voltage Vsense2 (of, about 0V) and then is in a floating state within the first preset time. At this time, the sensing signal terminal Sense starts to be charged, that is, a sensing signal line starts to be charged.

Then, the second control terminal G2 and the third control terminal G3 output a low level respectively. At this time, both the second transistor T2 and the third transistor T3 are turned off. At the same time, a charging voltage at the sensing signal terminal Sense is detected, a mobility is acquired according to the charging voltage, and a mobility compensation value is acquired according to the mobility (as in the related art, which will not be described in detail here.)

Finally, the second control terminal G2 and the third control terminal G3 output a high level respectively. At this time, both the second transistor T2 and the third transistor T3 are turned on. At the same time, the data terminal DATA outputs a third data voltage Vdata3 and writes a voltage corresponding to the mobility compensation value (i.e., a mobility compensation voltage) to the sensing signal terminal Sense. The control of the light emission of the light emitting device OLED and the threshold voltage compensation and the mobility compensation for the dual-gate driving transistor DT are realized under the action of the third data voltage Vdata3, the mobility compensation voltage and the threshold voltage Vth stored in the first capacitor C1.

Figure 4:
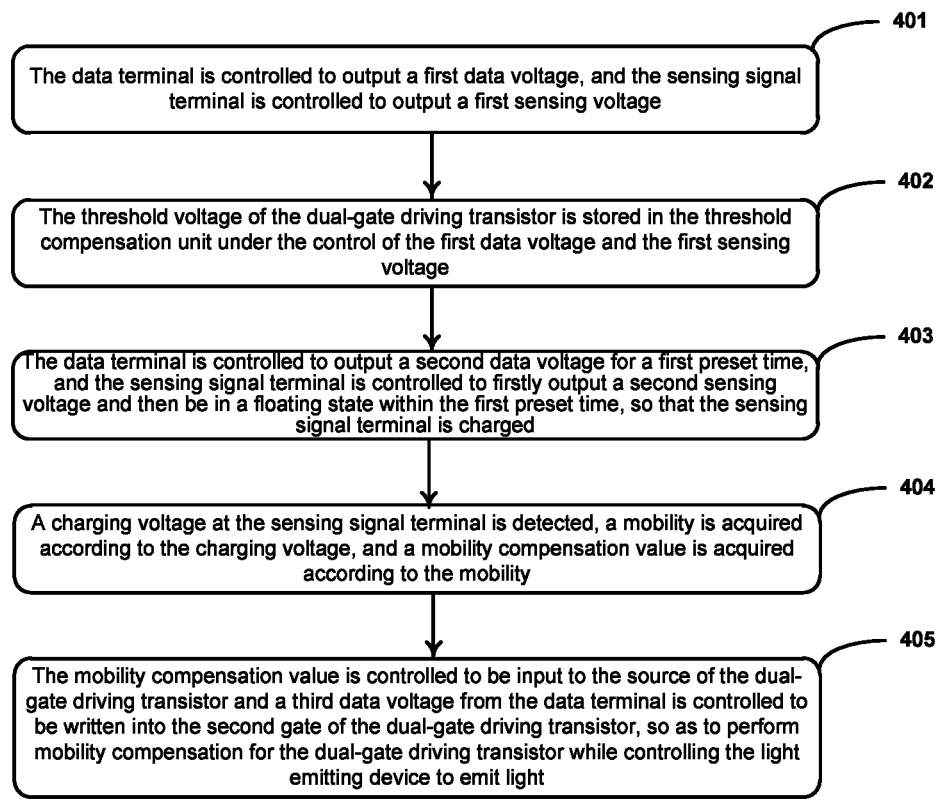
FIG. 4 is a flowchart of a driving method of a pixel circuit according to an embodiment of the present disclosure.

FIG. 4 is a flowchart of a driving method of a pixel circuit according to an embodiment of the present disclosure. As shown in FIG. 4, in step 401, the data terminal is controlled to output a first data voltage, and the sensing signal terminal is controlled to output a first sensing voltage.

In step 402, the threshold voltage of the dual-gate driving transistor is stored in the threshold compensation unit under the control of the first data voltage and the first sensing voltage.

In step 403, the data terminal is controlled to output a second data voltage for a first preset time, and the sensing signal terminal is controlled to firstly output a second sensing voltage and then be in a floating state within the first preset time, so that the sensing signal terminal is charged.

In step 404, a charging voltage at the sensing signal terminal is detected, a mobility is acquired according to the charging voltage, and a mobility compensation value is acquired according to the mobility.

In step 405, the mobility compensation value is controlled to be input to the source of the dual-gate driving transistor and a third data voltage from the data terminal is controlled to be written into the second gate of the dual-gate driving transistor, so as to perform mobility compensation for the dual-gate driving transistor while controlling the light emitting device to emit light.

An operation process of the pixel circuit shown in FIG. 3 will be further described below with reference to FIG. 5.

Figure 5:
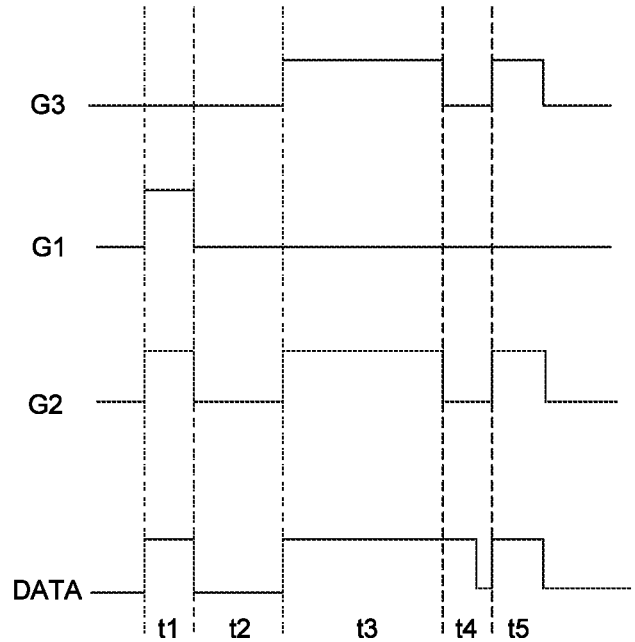
FIG. 5 is a control timing diagram of the pixel circuit shown in FIG. 3.

As shown in FIG. 5, the following five phases may be included in a frame time for display of the pixel circuit.

In a first phase t1 (reset phase), both the first control terminal G1 and the second control terminal G2 output a high level, both the first transistor T1 and the second transistor T2 are turned on, the sensing signal terminal Sense outputs a first sensing voltage Vsense1 (also referred to as a reset voltage Vsense1 of typically 0V), and the data terminal DATA outputs a first data voltage Vdata1 (also referred to as a data voltage Vdata1 of typically 2V.)

In a second phase t2 (threshold voltage storage phase), all the first control terminal G1, the second control terminal G2, and the third control terminal G3 are at a low level, all the first transistor T1, the second transistor T2, and the third transistor T3 are turned off, a voltage at the other terminal of the first capacitor C1 starts to be charged to Vdata1-Vth, and a voltage stored in the first capacitor C1 is Vth.

In a third phase t3 (mobility detection phase), both the second control terminal G2 and the third control terminal G3 output a high level, both the second transistor T2 and the third transistor T3 are turned on, the data terminal DATA outputs a second data voltage Vdata2 (of, typically, 3V) for mobility detection, and at the same time, after the sensing signal terminal Sense outputs a second sensing voltage Vsense2, i.e., an initial voltage (of, typically, 0V), the sensing signal voltage Sense is in a floating state. At this time, the sensing signal terminal Sense starts to be charged. It should be illustrated that, in various frame times, the same second data voltage Vdata2 is written at the same time. Therefore, a voltage difference detected at the sensing signal terminal Sense is a mobility difference.

In a fourth phase t4 (charging voltage acquisition phase), all the first control terminal G1, the second control terminal G2, and the third control terminal G3 output a low level, all the first transistor T1, the second transistor T2, and the third transistor T3 are turned off, the sensing signal terminal Sense detects a charging voltage, a mobility variation condition may be obtained by comparing the charging voltage with a standard voltage stored in an external memory, and then a mobility compensation value may be obtained according to the mobility variation condition using a corresponding algorithm.

In a fifth phase t5 (writing back data phase), both the second control terminal G2 and the third control terminal G3 output a high level, both the second transistor T2 and the third transistor T3 are turned on, the data terminal DATA outputs a third data voltage Vdata3 for the light emitting device OLED to emit light, and the sensing signal terminal Sense outputs a mobility compensation voltage corresponding to the mobility compensation value. At the same time, as a voltage difference on the first capacitor C1 is always constant, the threshold voltage Vth of the dual-gate driving transistor DT is fixed. Therefore, when the light emitting device OLED emits light, threshold voltage compensation and mobility compensation can be performed for the dual-gate driving transistor DT at the same time to ensure the uniform display.

That is, in the embodiments of the present disclosure, a dual-gate driving transistor structure is used, and a dual-capacitor structure is provided to store the threshold voltage $V_{th}$ and the gate-source voltage Vgs respectively, so that the threshold voltage and the mobility can be compensated at the same time to obtain better picture quality. Further, the threshold voltage compensation can be performed without writing the data of the threshold voltage back, which greatly saves the compensation time and increases the display time. Moreover, the entire pixel circuit has a simple structure and a simple control timing, which greatly reduces the production cost and the complexity of control etc.

In addition, it should be illustrated that in the above embodiments, all the first transistor T1, the second transistor T2, and the third transistor T3 are transistors which are turned on at a high level, for example, P-type TFT transistors which are turned on at a high level. However, in other embodiments of the present disclosure, transistors which are turned on at a low level may also be used, which is not specifically limited herein, except that corresponding control terminals output an opposite level during control.

In conclusion, according to the pixel circuit of the embodiments of the present disclosure, a dual-gate driving transistor has a drain electrically connected to a first power supply terminal; a threshold voltage compensation unit is electrically connected to a data terminal, a first control terminal, a first gate of the dual-gate driving transistor, and a source of the dual-gate driving transistor respectively; a mobility compensation unit is electrically connected to a sensing signal terminal, a second control terminal, and the source of the dual-gate driving transistor respectively; and a light emitting control unit is electrically connected to the data terminal, a third control terminal, a second gate of the dual-gate driving transistor, the source of the dual-gate driving transistor, and a light emitting device respectively. The threshold voltage compensation unit and the mobility compensation unit perform threshold voltage compensation for the dual-gate driving transistor under the control of the data terminal, the first control terminal, the sensing signal terminal, and the second control terminal; and the mobility compensation unit and the light emitting control unit perform mobility compensation for the dual-gate driving transistor and control the dual-gate driving transistor to drive the light emitting device to emit light under the control of the sensing signal terminal, the second control terminal, the data terminal, and the third control terminal. Thus, not only the threshold voltage compensation and the mobility compensation for the driving transistor can be realized at the same time, but also the problem of non-uniform display due to the drift in the threshold voltage and the variation in the mobility can be effectively improved, and the compensation method is simple and reliable.

Figure 6:
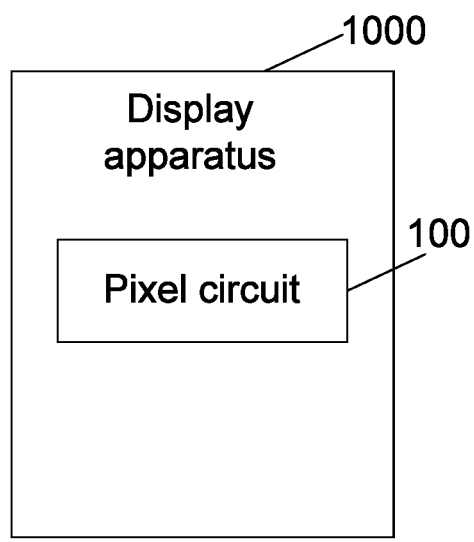
FIG. 6 is a block diagram of a display apparatus according to an embodiment of the present disclosure.

FIG. 6 is a block diagram of a display apparatus according to an embodiment of the present disclosure. As shown in FIG. 6, the display apparatus 1000 according to the embodiment of the present disclosure comprises the pixel circuit 100 described above.

According to the display apparatus of the embodiments of the present disclosure, not only the threshold voltage compensation and the mobility compensation for the driving transistor can be realized at the same time, but also the problem of non-uniform display due to the drift in the threshold voltage and the variation in the mobility can be effectively improved, and the compensation method is simple and reliable.

Figure 7:
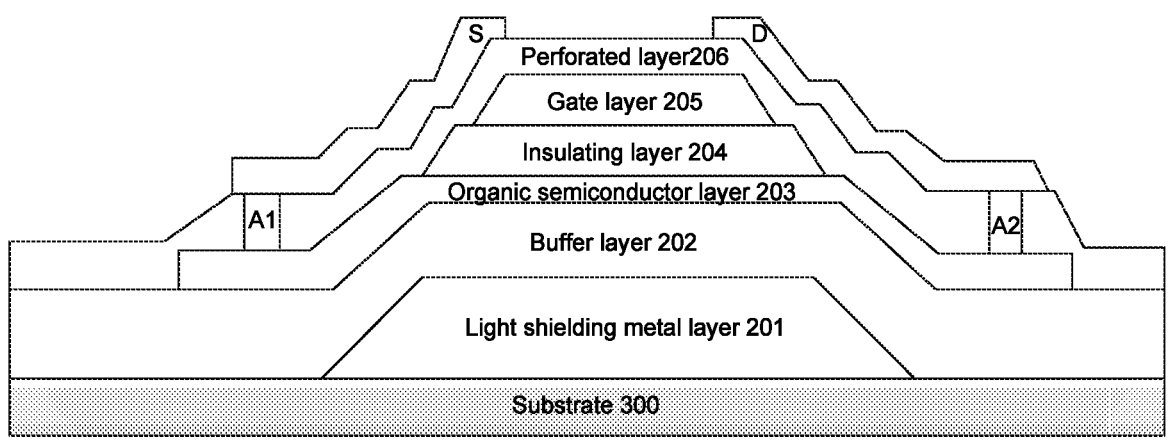
FIG. 7 is a structural diagram of a dual-gate driving transistor according to an embodiment of the present disclosure.

FIG. 7 is a structural diagram of a dual-gate driving transistor according to an embodiment of the present disclosure. As shown in FIG. 7, the dual-gate driving transistor according to the embodiment of the present disclosure comprises a light shielding metal layer 201, a buffer layer 202, an organic semiconductor layer 203, an insulating layer 204, a gate layer 205, a perforated layer 206, a source layer S, and a drain layer D.

The light shielding metal layer 201 is disposed on the substrate 300 (which may be glass), and serves as a second gate (also referred to as a bottom gate) of the dual-gate driving transistor; the buffer layer 202 is disposed on the light shielding metal layer 201 and the substrate 300; the buffer layer 202 is a non-metal layer; the organic semiconductor layer 203 is disposed on the buffer layer 202; the insulating layer 204 is disposed on the organic semiconductor layer 203; the gate layer 205 is disposed on the insulating layer 204, serves as a first gate (also referred to as a top gate) of the dual-gate driving transistor, and is a metal layer; the perforated layer 206 is disposed on the buffer layer 202, the organic semiconductor layer 203, the insulating layer 204, and the gate layer 205, and comprises a first via hole A1 and a via hole A2, and is an inorganic layer through which perforation is performed; and the source layer S and the drain layer D are proposed on the perforated layer 206 respectively, wherein the source layer S is connected to one terminal of the organic semiconductor layer 203 through the first via hole A1, and the drain layer D is connected to the other terminal of the organic semiconductor layer 203 through the second via hole A2.

In the dual-gate driving transistor shown in FIG. 7, the gate layer 205 serves as one metal electrode of the dual-gate driving transistor to form the first gate, i.e., the top gate, of the dual-gate driving transistor, and the light shielding metal layer 201 serves as the other metal electrode of the dual-gate driving transistor to form the second gate, i.e., the bottom gate, of the dual-gate driving transistor. With such a structure, a driving transistor having two gates can be obtained.

It can be known from the structure of the dual-gate driving transistor shown in FIG. 7 that it can be directly obtained by improving the existing single-gate driving transistor, i.e., using the gate of the existing driving transistor as one gate of the dual-gate driving transistor, and using the existing light shielding metal layer as the other gate of the dual-gate driving transistor. In this way, a driving transistor having two gates can be obtained, which can greatly reduce the development and production costs of the dual-gate driving transistor, and compared to realizing a dual-gate function by two driving transistors which are connected in series, can effectively scale down the structure of the entire transistor, thereby reducing the occupied area.

According to the dual-gate driving transistor of the embodiments of the present disclosure, the gate layer is used as one gate of the dual-gate driving transistor, and the light shielding metal layer is used as the other gate of the dual-gate driving transistor. In this way, the development and production costs of the dual-gate driving transistor can be greatly reduced, and compared to realizing a dual-gate function by two driving transistors which are connected in series, the structure of the entire transistor can be effectively scaled down, thereby reducing the occupied area.

In the description of the present disclosure, it is to be understood that orientation or positional relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", "counterclockwise", "axial", "radial", "circumferential" etc. are based on the orientation or positional relationships shown in the accompanying drawings, and are merely for the convenience of describing the present disclosure and simplifying the description, but do not indicate or suggest that the indicated apparatus or element must have a particular orientation, or must be constructed and operated in a particular orientation, and therefore should not be construed as limiting the present disclosure.

Furthermore, the terms "first" and "second" are used for descriptive purposes only, and are not to be construed as indicating or implying relative importance or implicitly indicating a number of indicated technical features. Thus, features defined by "first" and "second" may explicitly or implicitly indicate that least one of the features is included. In the description of the present disclosure, "plurality" means at least two, such as two, three, etc., unless explicitly and specifically defined otherwise.

In the present disclosure, the terms "install," "connect with," "connect to," "fix," etc. shall be understood in a broad sense unless specifically defined or stipulated otherwise. For example, they may be fixed connections, or detachable connections, or integral connections; or may be mechanical connections or electrical connections; or may be direct connections, or indirect connections through an intermediary; or may be internal connections between two elements or interactions between two elements, unless explicitly defined otherwise. Those of ordinary skill in the art can understand the specific meanings of the above terms in the present disclosure according to specific conditions.

In the present disclosure, unless specifically stipulated and defined otherwise, the first feature "above" or "below" the second feature may be that the first feature and the second feature are in direct contact, or that the first feature and the second feature are in indirect contact via an intermediary. Further, the first feature "above", "on" and "on top of" the second feature may be that the first feature is directly above or diagonally above the second feature, or may simply indicate that the first feature is higher than the second feature in height. The first feature "under", "below" and "beneath" the second feature may be that the first feature is directly below or diagonally below the second feature, or may simply indicate that the first feature is lower than the second feature.

In the description of the present specification, the description referring to the terms "one embodiment", "some embodiments", "an example", "a specific example", or "some examples" etc. means that a specific feature, structure, material or characteristics described in conjunction with the embodiment or example is included in at least one embodiment or example of the present disclosure. In the present specification, schematic expressions of the above terms do not necessarily have to refer to the same embodiment or example. Furthermore, the specific feature, structure, material, or characteristics described may be combined in any suitable manner in any one or more embodiments or examples. In addition, those skilled in the art can combine and merge different embodiments or examples described in the present specification and features in different embodiments or examples without conflicting with each other.

Although the embodiments of the present disclosure have been shown and described above, it can be understood that the above embodiments are exemplary and are not to be construed as limiting the present disclosure. Those of ordinary skill in the art can make changes, modifications, substitutions and variations to the above embodiments within the scope of the present disclosure.

We claim:

1. A pixel circuit, comprising:
   a dual-gate driving transistor having a drain electrically connected to a first power supply terminal;
   a threshold voltage compensation unit electrically connected to a data terminal, a first control terminal, a first gate of the dual-gate driving transistor, and a source of the dual-gate driving transistor respectively;
   a mobility compensation unit electrically connected to a sensing signal terminal, a second control terminal, and the source of the dual-gate driving transistor respectively; and
   a light emitting control unit electrically connected to the data terminal, a third control terminal, a second gate of the dual-gate driving transistor, the source of the dual-gate driving transistor, and a light emitting device respectively,
   wherein, the threshold voltage compensation unit and the mobility compensation unit perform threshold voltage compensation for the dual-gate driving transistor under the control of the data terminal, the first control terminal, the sensing signal terminal, and the second control terminal;
   the mobility compensation unit and the light emitting control unit perform mobility compensation for the dual-gate driving transistor and control the dual-gate driving transistor to drive the light emitting device to emit light under the control of the sensing signal terminal, the second control terminal, the data terminal, and the third control terminal,
   the data terminal outputs a second data voltage for a first preset time, and the sensing signal terminal firstly outputs a second sensing voltage and then is in a floating state within the first preset time, so that the sensing signal terminal is charged, when both the second control terminal and the third control terminal output a high level;
   a charging voltage at the sensing signal terminal is detected, a mobility of the dual-gate driving transistor is acquired according to the charging voltage, and a mobility compensation value is acquired according to the mobility, when all the first control terminal, the second control terminal and the third control terminal output a low level, and
   the source of the dual-gate driving transistor receives the mobility compensation value, and the second gate of the dual-gate driving transistor receives a third data voltage from the data terminal to perform mobility compensation for the dual-gate driving transistor while the light emitting control unit controls the light emitting device to emit light, when both the second control terminal and the third control terminal output the high level.

2. The pixel circuit according to claim 1, wherein the threshold voltage compensation unit comprises:
   a first transistor having a source electrically connected to the data terminal, and a gate electrically connected to the first control terminal; and
   a first capacitor having one terminal electrically connected to a drain of the first transistor and the first gate of the dual-gate driving transistor respectively, and the other terminal electrically connected to the source of the dual-gate driving transistor.

3. The pixel circuit according to claim 2, wherein the mobility compensation unit comprises:
   a second transistor having a source electrically connected to the sensing signal terminal, a gate electrically connected to the second control terminal, and a drain electrically connected to the source of the dual-gate driving transistor and the other terminal of the first capacitor respectively.

4. The pixel circuit according to claim 3, wherein when both the first transistor and the second transistor are turned on under the control of the first control terminal and the second control terminal, the data terminal outputs a first data voltage, and the sensing signal terminal outputs a first sensing voltage, and when both the first transistor and the second transistor are turned off under the control of the first control terminal and the second control terminal, the first capacitor stores a threshold voltage of the dual-gate driving transistor under the action of both the first data voltage and the first sensing voltage.

5. The pixel circuit according to claim 4, wherein the first data voltage is greater than the threshold voltage of the dual-gate driving transistor, and the first sensing voltage is zero.

6. The pixel circuit according to claim 3, wherein the light emitting control unit comprises:
   a third transistor having a source electrically connected to the data terminal, and a gate electrically connected to the third control terminal; and
   a second capacitor having one terminal electrically connected to a drain of the third transistor and the second gate of the dual-gate driving transistor respectively, and the other terminal electrically connected to the source of the dual-gate driving transistor and one terminal of the light emitting device, wherein the other terminal of the light emitting device is electrically connected to a second power supply terminal.

7. The pixel circuit according to claim 6, wherein
   when the second transistor and the third transistor are turned on under the control of the second control terminal and the third control terminal, the data terminal outputs a second data voltage for a first preset time, and the sensing signal terminal firstly outputs a second sensing voltage and then is in a floating state within the first preset time, so that the sensing signal terminal is charged;
   when the second transistor and the third transistor are turned off under the control of the second control terminal and the third control terminal, the mobility compensation unit is configured to detect a charging voltage at the sensing signal terminal, acquire a mobility according to the charging voltage, and acquire a mobility compensation value according to the mobility; and
   when the second transistor and the third transistor are turned on under the control of the second control terminal and the third control terminal, the source of the dual-gate driving transistor receives the mobility compensation value, and the second gate of the dual-gate driving transistor receives a third data voltage from the data terminal to perform mobility compensation for the dual-gate driving transistor while the light emitting control unit controls the light emitting device to emit light.

8. The pixel circuit according to claim 7, wherein a sum of the second data voltage and the second sensing voltage is less than a voltage required for the light emitting device to emit light.

9. A display apparatus, comprising the pixel circuit according to claim 1.

10. A driving method of the pixel circuit according to claim 1, comprising:
- in a first phase, controlling the data terminal to output a first data voltage, and controlling the sensing signal terminal to output a first sensing voltage;
- in a second phase, storing a threshold voltage of the dual-gate driving transistor in the threshold compensation unit under the control of the first data voltage and the first sensing voltage;
- in a third phase, controlling the data terminal to output a second data voltage for a first preset time, and controlling the sensing signal terminal to firstly output a second sensing voltage and then be in a floating state within the first preset time, so that the sensing signal terminal is charged;
- in a fourth phase, detecting a charging voltage at the sensing signal terminal, acquiring a mobility according to the charging voltage, and acquiring a mobility compensation value according to the mobility; and
- in a fifth phase, controlling to input the mobility compensation value into the source of the dual-gate driving transistor, and writing a third data voltage from the data terminal into the second gate of the dual-gate driving transistor, to perform mobility compensation for the dual-gate driving transistor while the light emitting control unit controls the light emitting device to emit light.

* * * * *